United States Patent
Lin et al.

(10) Patent No.: US 9,564,889 B2
(45) Date of Patent: Feb. 7, 2017

(54) GATE DRIVING CIRCUIT AND DISPLAY DEVICE HAVING THE SAME

(71) Applicant: AU Optronics Corp., Hsin-Chu (TW)

(72) Inventors: Chen-Chi Lin, Hsin-Chu (TW); Chun-Hsin Liu, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 207 days.

(21) Appl. No.: 14/296,421

(22) Filed: Jun. 4, 2014

(65) Prior Publication Data
US 2015/0070255 A1    Mar. 12, 2015

(30) Foreign Application Priority Data
Sep. 6, 2013   (TW) .............................. 102132302 U

(51) Int. Cl.
*G09G 5/00*     (2006.01)
*H03K 17/56*    (2006.01)
*G09G 3/32*     (2016.01)

(52) U.S. Cl.
CPC ............ *H03K 17/56* (2013.01); *G09G 3/3266* (2013.01); *G09G 2310/0286* (2013.01)

(58) Field of Classification Search
CPC ..................... G09G 2310/0286; G09G 3/3266; H03K 17/56

USPC ........................................................... 345/204
See application file for complete search history.

(56) References Cited

U.S. PATENT DOCUMENTS

| | | | |
|---|---|---|---|
| 8,004,482 B2 | 8/2011 | Lee | |
| 2005/0134545 A1* | 6/2005 | Jang | G09G 3/3688 345/100 |
| 2006/0028463 A1* | 2/2006 | Nakamura | G09G 3/3677 345/204 |
| 2008/0192041 A1* | 8/2008 | Ho | G09G 3/3677 345/212 |

* cited by examiner

*Primary Examiner* — Jonathan Boyd
(74) *Attorney, Agent, or Firm* — McClure, Qualey & Rodack, LLP

(57) ABSTRACT

A gate driving circuit includes plural-stage output circuits, an Nth stage output circuit of the plural-stage output circuits includes an Nth stage shift register and a mixer. The Nth stage shift register is configured to output an Nth pulse signal. The mixer is coupled to the Nth stage shift register and an (N+M)th stage shift register, for respectively outputting a first clock signal and a predetermined pulse signal during different periods according to the Nth pulse signal and an (N+M)th pulse signal of the (N+M)th stage shift register. Wherein pulse widths or phases of the first clock signal and the predetermined pulse signal are different, and N and M are positive integers.

13 Claims, 7 Drawing Sheets

GATE DRIVING CIRCUIT AND DISPLAY DEVICE HAVING THE SAME

BACKGROUND OF THE INVENTION

1. Field of the Invention

The present invention relates to a gate driving circuit, and more particularly, to a gate driving circuit capable of outputting a gate signal with two different pulses.

2. Description of the Prior Art

An organic light emitting diode display device is a display device utilizing organic light emitting diode pixels to emit light for displaying images. Brightness of an organic light emitting diode is proportional to amount of current flowing through the organic light emitting diode. Generally, in order to control the amount of the current flowing through the organic light emitting diode, the organic light emitting diode pixel comprises a current control switch for controlling the amount of the current flowing through the organic light emitting diode according to a display voltage at a gate terminal of the current control switch, so as to further control the brightness of the organic light emitting diode.

However, a threshold voltage of the current control switch of each organic light emitting diode pixel may be different. The difference of the threshold voltage of the current control switch may affect the brightness of the organic light emitting diode. In order to compensate the difference of the threshold voltage of the organic light emitting diode pixel, a compensation circuit is arranged within each organic light emitting diode pixel to operate with pulse signals having different pulse widths or phases. The gate driving circuit of the prior art can only output one kind of pulse signal, and is not able to output a gate signal with two different pulses according to design of the compensation circuit. Therefore, an additional signal generation circuit must be arranged in the organic light emitting diode display device of the prior art for providing other kind of pulse signal, such that the organic light emitting diode display device of the prior art has a more complex hardware structure.

SUMMARY OF THE INVENTION

The present invention provides a gate driving circuit comprising plural-stage output circuits. An Nth stage output circuit of the plural-stage output circuits comprises an Nth stage shift register and a mixer. The Nth stage shift register is configured to output an Nth pulse signal. The mixer is coupled to the Nth stage shift register and an (N+M)th stage shift register, for respectively outputting a first clock signal and a predetermined pulse signal during different periods according to the Nth pulse signal and an (N+M)th pulse signal of the (N+M)th stage shift register. Wherein pulse widths or phases of the first clock signal and the predetermined pulse signal are different, and N and M are positive integers.

The present invention further provides a display device comprising a pixel matrix having a plurality of pixels; a plurality of data lines configured to transmit data signals to the plurality of pixels; a plurality of scan lines configured to transmit gate signals to the plurality of pixels; and a gate driving circuit comprising plural-stage output circuits. An Nth stage output circuit of the plural-stage output circuits comprises an Nth stage shift register configured to output an Nth pulse signal; and a mixer coupled to the Nth stage shift register and an (N+M)th stage shift register, for outputting a Nth gate signal according to the Nth pulse signal and an (N+M)th pulse signal of the (N+M)th stage shift register, the Nth gate signal comprising at least two pulses with different duty cycles or phases; Wherein N and M are positive integers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
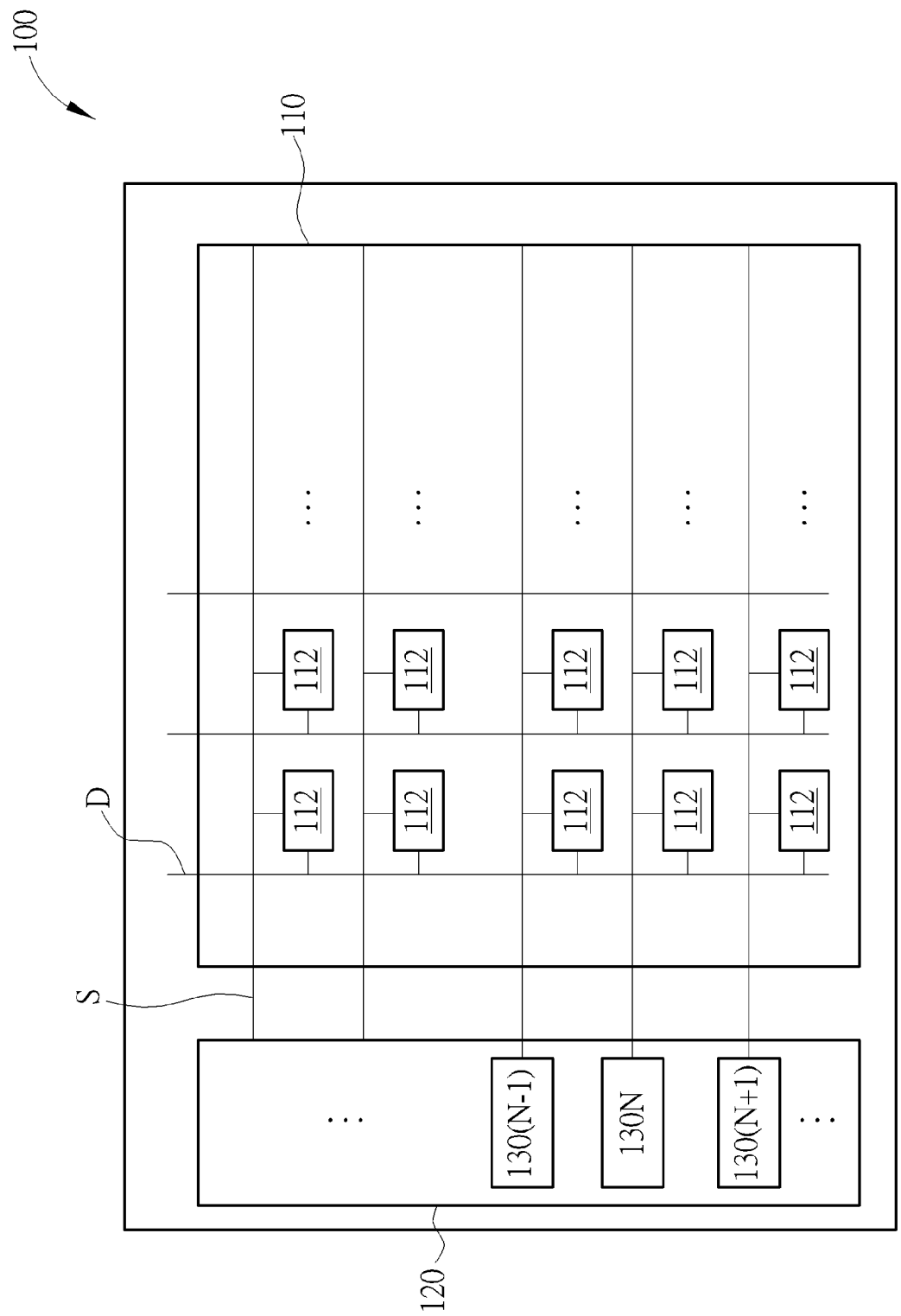
FIG. 1 is a diagram showing a display device of the present invention.

Please refer to FIG. 1. FIG. 1 is a diagram showing a display device of the present invention. As shown in FIG. 1, the display device 100 of the present invention comprises a pixel matrix 110, a plurality of data lines D, a plurality of scan lines S and a gate driving circuit 120. The pixel matrix 110 comprises a plurality of pixels 112. The plurality of data lines are configured to transmit data signals to the plurality of pixels 112. The plurality of scan lines are configured to transmit gate signals to the plurality of pixels 112. The gate driving circuit 120 comprises plural-stage output circuits 130. Each stage output circuit 130 is configured to output a gate driving signal with two different pulses via the scan line S for driving a compensation circuit of the pixel 112, in order to compensate a threshold voltage of a driving transistor in the pixel 112, and then the pixel 112 can be driven by a written voltage from a data driving circuit to display image. In the present embodiment, the compensation circuit of the pixel 122 can be any type of compensation circuit, thus no further explanation is provided.

Figure 2:
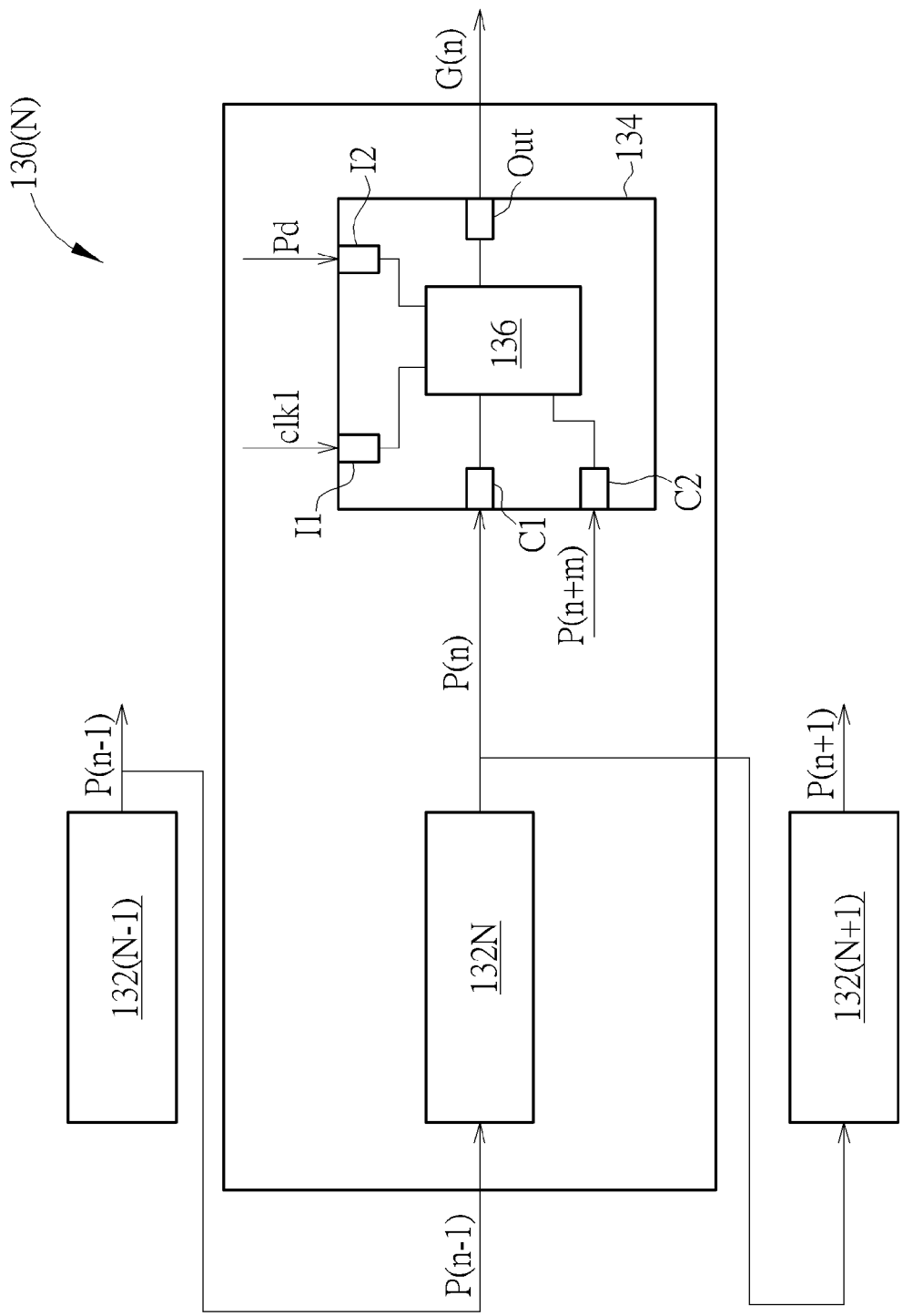
FIG. 2 is a diagram showing a first embodiment of an Nth stage output circuit.

Please refer to FIG. 2, and refer to FIG. 1 as well. FIG. 2 is a diagram showing a first embodiment of an Nth stage output circuit. For ease of explanation, only an internal structure of the Nth stage output circuit 130N is illustrated in FIG. 2. The other output circuits are similar to the Nth stage output circuit 130N, thus, no further illustration is provided. As shown in FIG. 2, the Nth stage output circuit 130N comprises an Nth stage shift register 132N and a mixer 134. The Nth stage shift register 132N is configured to output an Nth pulse signal P(n), and the Nth pulse signal P(n) is outputted subsequent to a falling edge of a (N−1)th pulse signal P(n−1). Similarly, The (N+1)th stage shift register 132 (N+1) is configured to output an (N+1)th pulse signal P(n+1), and the (N+1)th pulse signal P(n+1) is outputted subsequent to a falling edge of a Nth pulse signal P(n), and so forth. The mixer 134 of the Nth stage output circuit 130N is coupled to output terminals of the Nth stage shift register 132N and an (N+M)th stage shift register, for outputting different pulses during different periods according to the Nth pulse signal P(n) and an (N+M)th pulse signal P(n+m) of the (N+M)th stage shift register, wherein N and M are positive integers.

Figure 3:
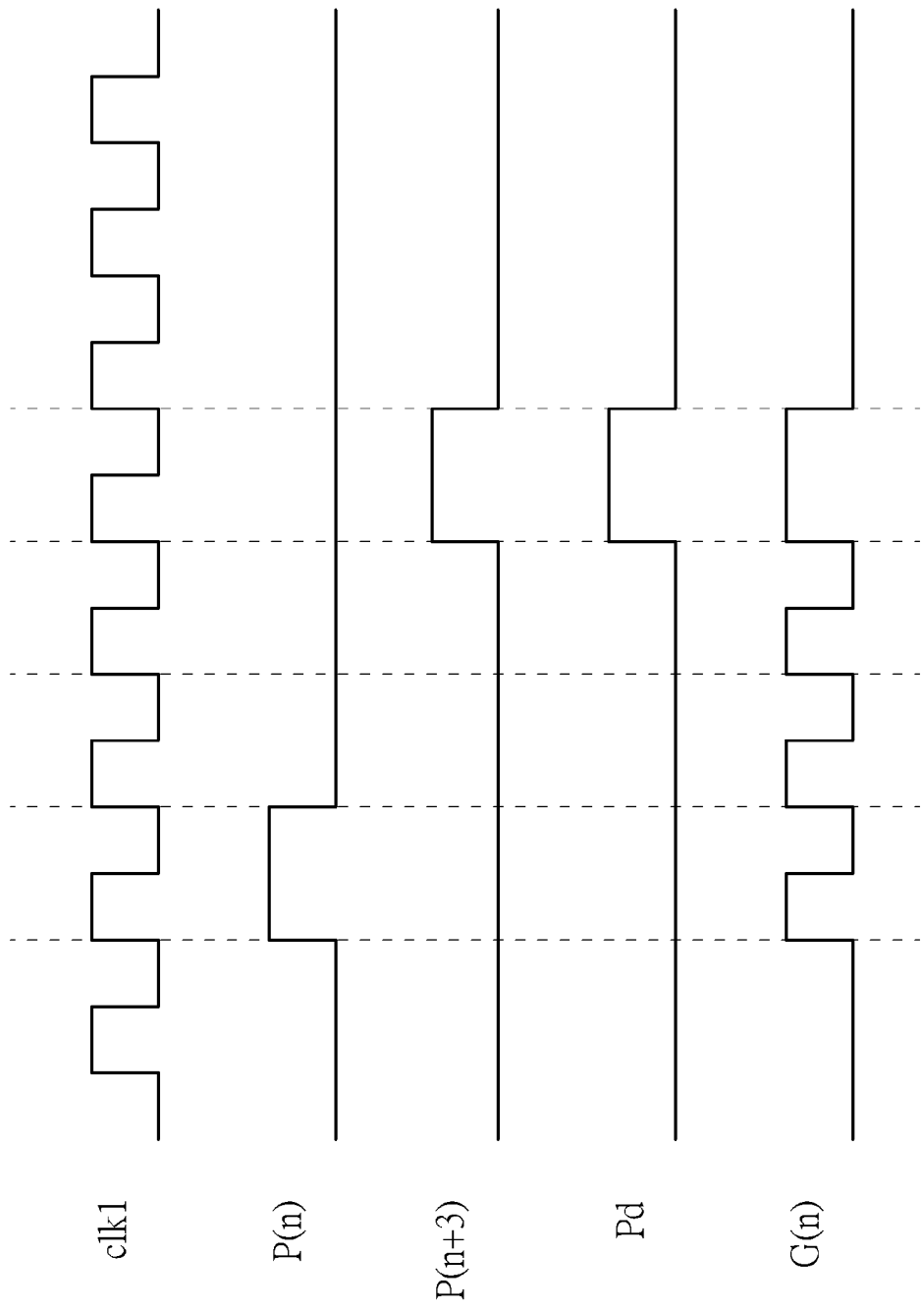
FIG. 3 is a diagram showing waveforms of related signals of the Nth stage output circuit in FIG. 2.

For example, please refer to FIG. 3, and refer to FIG. 2 as well. FIG. 3 is a diagram showing waveforms of related signals of the Nth stage output circuit in FIG. 2. As shown in figures, the mixer 134 of the Nth stage output circuit comprises a first input terminal I1, a second input terminal I2, a first control terminal C1, a second control terminal C2, a signal output terminal Out and a selection circuit 136. The first input terminal I1 is configured to receive a first clock signal clk1. The second input terminal I2 is configured to receive a predetermined pulse signal Pd. The first control terminal C1 is coupled to the Nth stage shift register 132N for receiving the Nth pulse signal P(n). The second control terminal C2 is coupled to the (N+M)th stage shift register for receiving the (N+M)th pulse signal P(n+m). The selection circuit 136 is configured to output the first clock signal clk1 (received at the first input terminal I1) at the signal output terminal Out when the mixer 134 receives the Nth pulse signal P(n), and output the predetermined pulse signal Pd (received at the second input terminal I1) at the signal output terminal Out when the mixer 134 receives the (N+M)th pulse signal P(n+m). In the present embodiment, the predetermined pulse signal Pd is the (N+M)th pulse signal P(n+m) (assuming M is 3), and pulse widths of the Nth pulse signal P(n) and the (N+M)th pulse signal P(n+m) are twice of a pulse width of the first clock signal clk1. But in other embodiment of the present invention, the pulse width of the Nth pulse signal P(n) and the (N+M)th pulse signal P(n+m) can be other times of the pulse width of the first clock signal clk1. Moreover, the Nth pulse signal P(n) is not limited to be directly following the falling edge of the (N−1)th pulse signal P(n−1). A rising edge of the Nth pulse signal P(n) and the falling edge of the (N−1)th pulse signal P(n−1) can be separated.

According to the above arrangement, the Nth stage output circuit can output the first clock signal clk1 when the Nth pulse signal P(n) is generated, and then output the (N+M)th pulse signal P(n+m), which has twice pulse width of the first clock signal clk1, when the (N+M)th pulse signal P(n+m) is generated, in other words, the gate signal G(n) outputted by the Nth stage output circuit 130N has at least two different pulses with different duty cycles (if the duty cycle of the (N+M)th pulse signal P(n+m) is 100%, then the duty cycle of the first clock signal is 50%).

Figure 4:
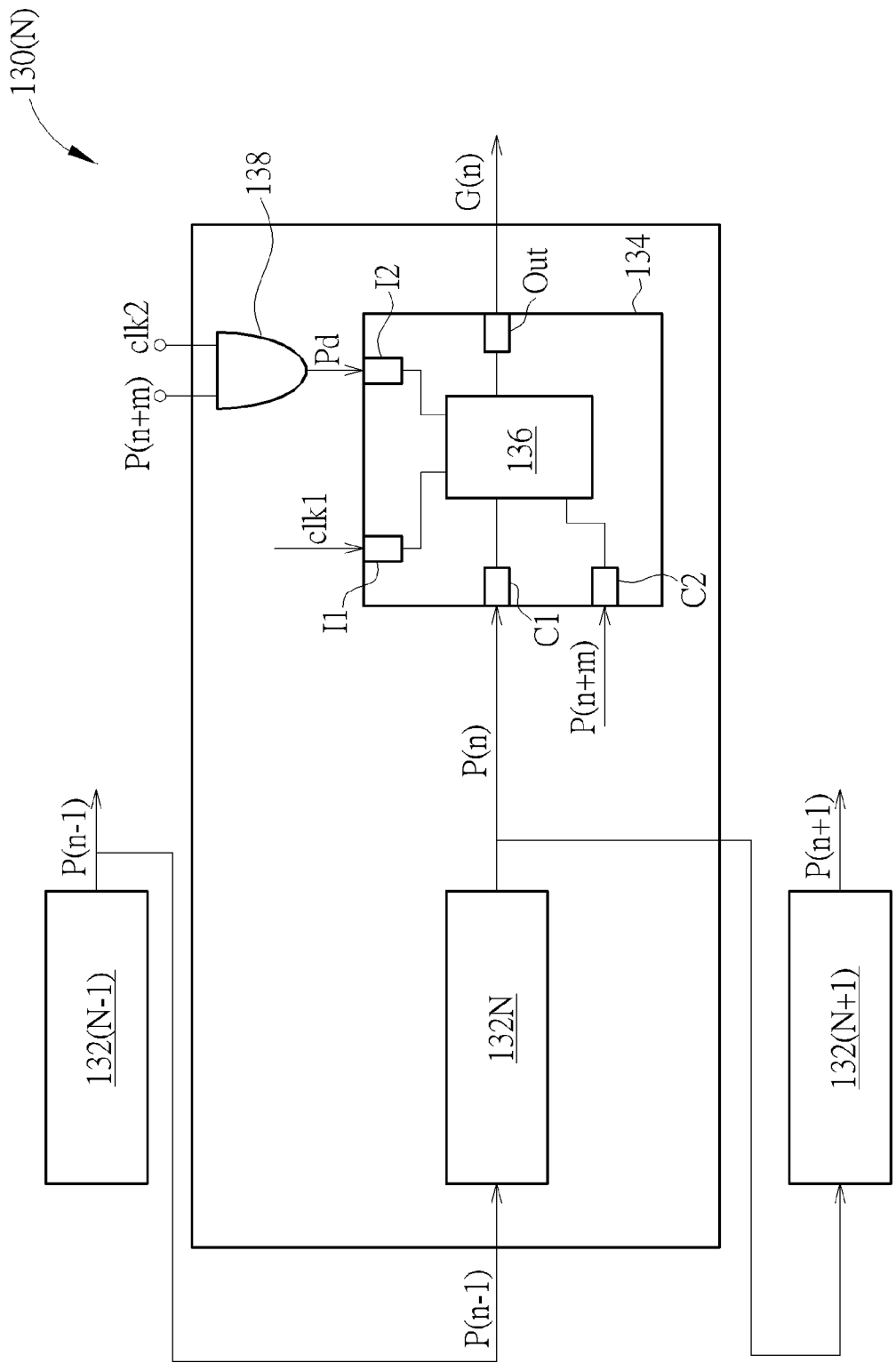
FIG. 4 is a diagram showing a second embodiment of the Nth stage output circuit.
Figure 5:
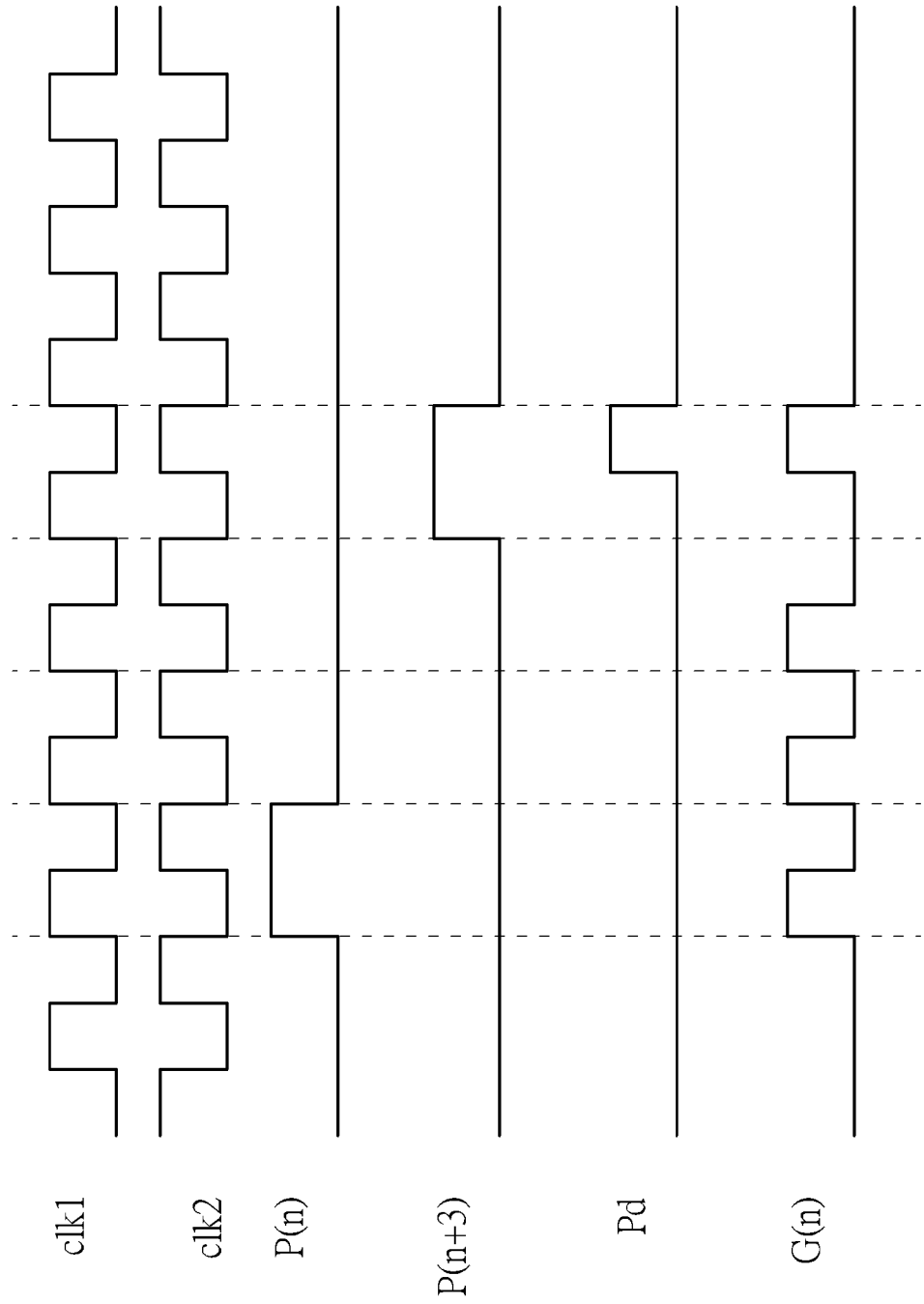
FIG. 5 is a diagram showing waveforms of related signals of the Nth stage output circuit in FIG. 4.

Please refer to FIG. 4 and FIG. 5 together. FIG. 4 is a diagram showing a second embodiment of the Nth stage output circuit. FIG. 5 is a diagram showing waveforms of related signals of the Nth stage output circuit in FIG. 4. Most features of the Nth stage output circuit 130N in FIG. 4 is identical to the Nth stage output circuit 130N in FIG. 2. Different from the Nth stage output circuit 130N in FIG. 2 is that the Nth stage output circuit 130N in FIG. 4 further comprises an AND gate 138. A first input terminal of the AND gate 138 is configured to receive the (N+M)th pulse signal P(n+m), a second input terminal of the AND gate 138 is configured to receive a second clock signal clk2, and an output terminal of the AND gate 138 is coupled to the second input terminal I2 of the mixer 134. In other words, in the present embodiment, the predetermined pulse Pd is an output signal of the AND gate 138. Since a phase of the second clock signal clk2 is opposite to the phase of the first clock signal clk1, a phase of the output signal of the AND gate 138 is opposite to the phase of the first clock signal clk1.

According to the above arrangement, the Nth stage output circuit can output the first clock signal clk1 when the Nth pulse signal P(n) is generated, and then output the predetermined pulse Pd, which has the phase opposite to the first clock signal, when the (N+M)th pulse signal P(n+m) is generated, in other words, the gate signal G(n) outputted by the Nth stage output circuit 130N has at least two different pulses with different phases. In addition, the first cock signal clk1 and the predetermined pulse signal Pd have a same pulse width, and the first cock signal clk1 and the predetermined pulse signal Pd outputted by the mixer 134 are two pulse width apart. Moreover, in other embodiment of the present invention, the first clock signal clk1 and the predetermined pulse signal Pd can be separated by other number of pulse widths.

Figure 6:
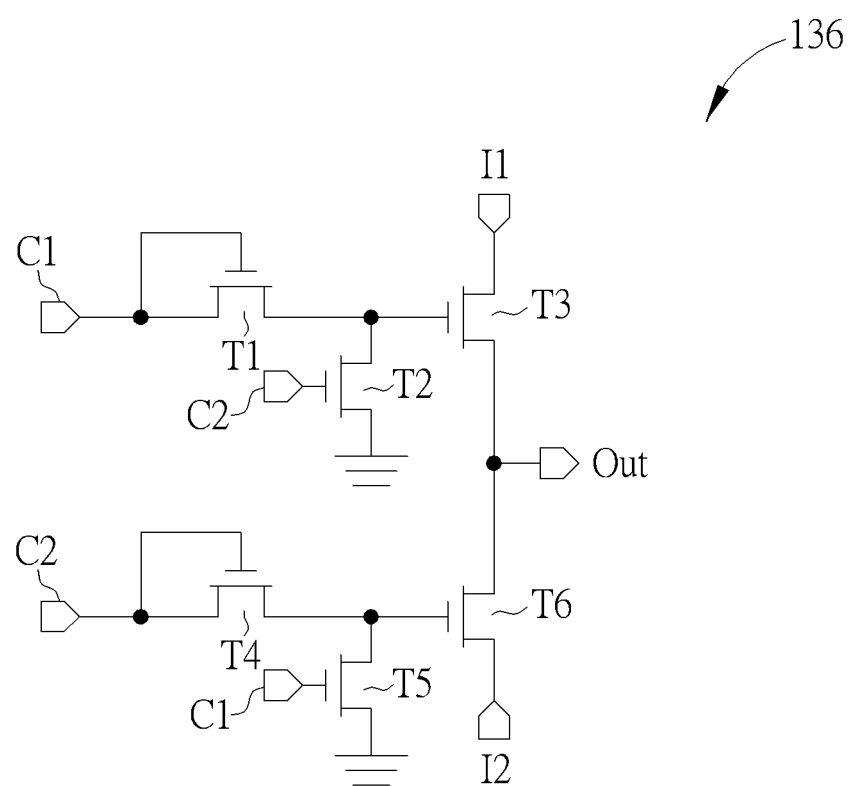
FIG. 6 is a diagram showing a first embodiment of a selection circuit.

Please refer to FIG. 6. FIG. 6 is a diagram showing a first embodiment of a selection circuit. As shown in FIG. 6, the selection circuit 136 comprises transistors T1-T6. A first terminal and a control terminal of the transistor T1 are coupled to the first control terminal C1. A first terminal of the transistor T2 is coupled to a second terminal of the transistor T1, a control terminal of the transistor T2 is coupled to the second control terminal C2, and a second terminal of the transistor T2 is coupled to a ground terminal. A first terminal of the transistor T3 is coupled to the first input terminal I1, a control terminal of the transistor T3 is coupled to the second terminal of the transistor T1, and a second terminal of the transistor T3 is coupled to the signal output terminal Out. A first terminal and a control terminal of the transistor T4 is coupled to the second control terminal C2. A first terminal of the transistor T5 is coupled to a second terminal of the transistor T4, a control terminal of the transistor T5 is coupled to the first control terminal C1, and a second terminal of the transistor T5 is coupled to the ground terminal. A first terminal of the transistor T6 is coupled to the second input terminal I2, a control terminal of the transistor T6 is coupled to the second terminal of the transistor T4, and a second terminal of the transistor T6 is coupled to the signal output terminal Out.

According to the above arrangement, when the first control terminal C1 receives the Nth pulse signal P(n), the selection circuit 136 outputs a signal, which is received at the first input terminal I1, at the signal output terminal Out; and when the second control terminal C2 receives the (N+m)th pulse signal P(n+m), the selection circuit 136 outputs a signal, which is received at the second input terminal I2, at the signal output terminal Out.

Figure 7:
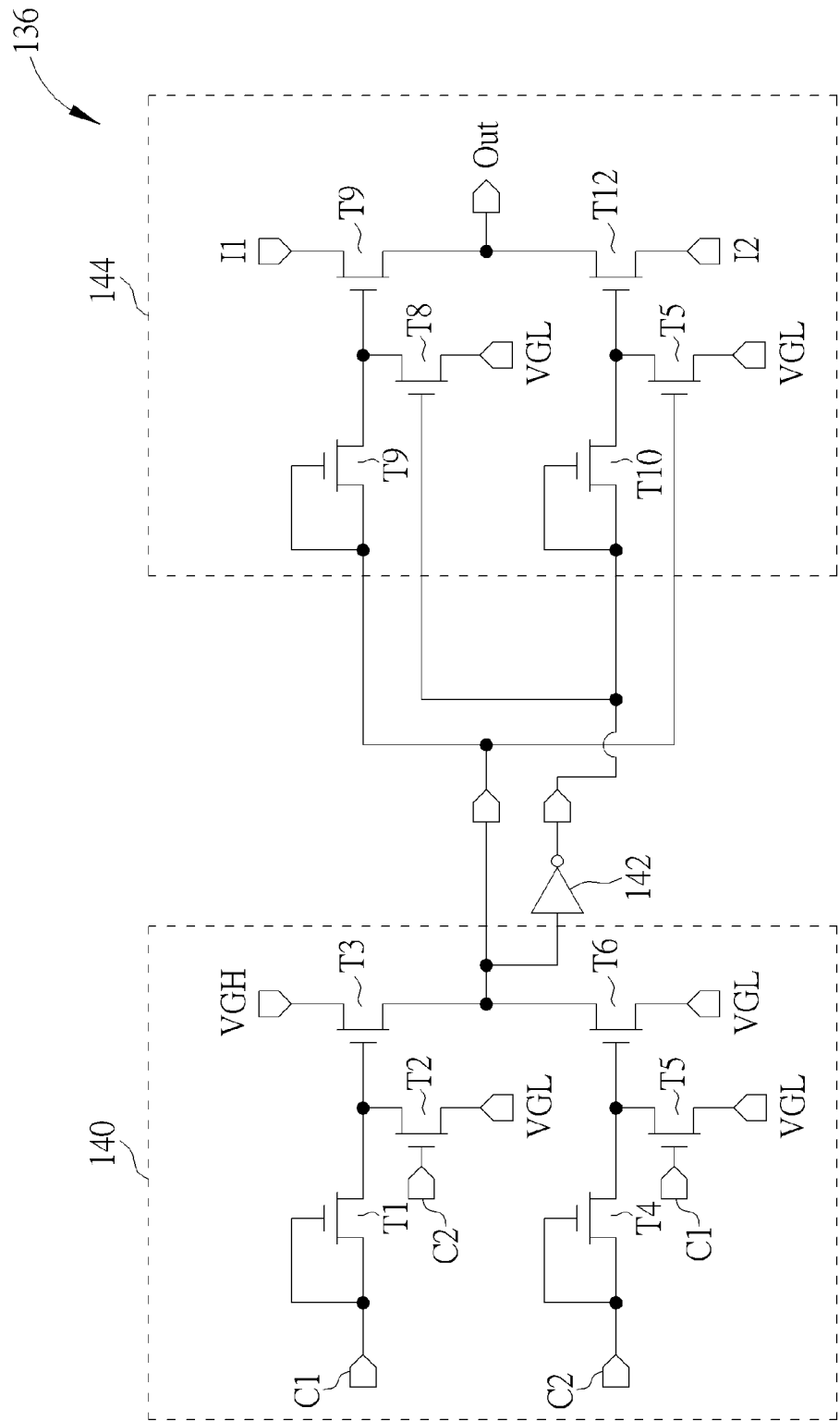
FIG. 7 is a diagram showing a second embodiment of the selection circuit.

Please refer to FIG. 7. FIG. 7 is a diagram showing a second embodiment of the selection circuit. As shown in FIG. 7, in order to make the gate signal G(n) outputted by the signal output terminal Out more precise, the selection circuit 136 in FIG. 7 comprises a first selection unit 140, an inverter 142 and a second selection unit 144. The first selection unit comprises transistors T1-T6. A first terminal and a control terminal of the transistor T1 are coupled to the first control terminal C1. A first terminal of the transistor T2 is coupled to a second terminal of the transistor T1, a control terminal of the transistor T2 is coupled to the second control terminal C2, and a second terminal of the transistor T2 is coupled to a low level voltage source VGL. A first terminal of the transistor T3 is coupled to a high level voltage source VGH, and a control terminal of the transistor T3 is coupled to the second terminal of the transistor T1. A first terminal and a control terminal of the transistor T4 are coupled to the second control terminal C2. A first terminal of the transistor T5 is coupled to a second terminal of the transistor T4, a control terminal of the transistor T5 is coupled to the first control terminal C1, and a second terminal of the transistor T5 is coupled to the low level voltage source VGL. A first terminal of the transistor T6 is coupled to the low level voltage source VGL, a control terminal of the transistor T6 is coupled to the second terminal of the transistor T4, and a second terminal of the transistor T6 is coupled to a second terminal of the transistor T3. An input terminal of the inverter 142 is coupled to the second terminal of the transistor T3. The second selection unit 144 comprises transistors T7-T12. A first terminal and a control terminal of the transistor T7 are coupled to the second terminal of the transistor T3. A first terminal of the transistor T8 is coupled to a second terminal of the transistor T7, a control terminal of the transistor T8 is coupled to an input terminal of the inverter 142, and a second terminal of the transistor T8 is coupled to the low level voltage source VGL. A first terminal of the transistor T9 is coupled to the first input terminal I1, a control terminal of the transistor T9 is coupled to the second terminal of the transistor T7, and a second terminal of the transistor T9 is coupled to the signal output terminal Out. A first terminal and a control terminal of the transistor T10 are coupled to the input terminal of the inverter 142. A first terminal of the transistor T11 is coupled to the second terminal of the transistor T10, a control terminal of the transistor T11 is coupled to the second terminal of the transistor T3, and a second terminal of the transistor T11 is coupled to the low level voltage source VGL. A first terminal of the transistor T12 is coupled to the second input terminal I2, a control terminal of the transistor T12 is coupled to the second terminal of the transistor T10, and a second terminal of the transistor T12 is coupled to the signal output terminal Out.

Similarly, according to the above arrangement, when the first control terminal C1 receives the Nth pulse signal P(n), the selection circuit 136 outputs a signal, which is received at the first input terminal I1, at the signal output terminal Out; and when the second control terminal C2 receives the (N+m)th pulse signal P(n+m), the selection circuit 136 outputs a signal, which is received at the second input terminal I2, at the signal output terminal Out.

In addition, the predetermined pulse Pd is not limited to the above two signals. In other embodiments of the present invention, the predetermined pulse Pd can have a different pulse and/or phase according to design requirements.

In contrast to the prior art, the gate driving circuit of the present invention has at least two different pulses with different duty cycles or phase, in order to compensate the threshold voltage of the pixel. The display device of the present invention does not need to arrange an additional signal generation circuit for providing different pulse signal. Therefore, the display device of the present invention has a simpler hardware structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate driving circuit, comprising plural-stage output circuits, an Nth stage output circuit of the plural-stage output circuits comprising:
    an Nth stage shift register configured to output an Nth pulse signal; and
    a mixer coupled to the Nth stage shift register and an (N+M)th stage shift register of an (N+M)th stage output circuit of the plural-stage output circuits connected to the Nth stage shift register in series, for respectively outputting a first clock signal and a predetermined pulse signal during different periods according to the Nth pulse signal and an (N+M)th pulse signal of the (N+M)th stage shift register;
    wherein pulse widths or phases of the first clock signal and the predetermined pulse signal are different, and N and M are positive integers.

2. The gate driving circuit of claim 1, wherein the mixer comprises:
    a first input terminal configured to receive the first clock signal;
    a second input terminal configured to receive the predetermined pulse signal;
    a first control terminal coupled to the Nth stage shift register for receiving the Nth pulse signal;
    a second control terminal coupled to the (N+M)th stage shift register for receiving the (N+M)th pulse signal;
    a signal output terminal; and
    a selection circuit configured to output the first clock signal at the signal output terminal when the mixer receives the Nth pulse signal, and output the predetermined pulse signal at the signal output terminal when the mixer receives the (N+M)th pulse signal.

3. The gate driving circuit of claim 2, wherein the selection circuit comprises:
    a first transistor having a first terminal and a control terminal coupled to the first control terminal;
    a second transistor having a first terminal coupled to a second terminal of the first transistor, a control terminal coupled to the second control terminal, and a second terminal coupled to a ground terminal;
    a third transistor having a first terminal coupled to the first input terminal, a control terminal coupled to the second terminal of the first transistor, and a second terminal coupled to the signal output terminal;
    a fourth transistor having a first terminal and a control terminal coupled to the second control terminal;
    a fifth transistor having a first terminal coupled to a second terminal of the fourth transistor, a control terminal coupled to the first control terminal, and a second terminal coupled to the ground terminal; and
    a sixth transistor having a first terminal coupled to the second input terminal, a control terminal coupled to the second terminal of the fourth transistor, and a second terminal coupled to the signal output terminal.

4. The gate driving circuit of claim 2, wherein the selection circuit comprises:
    a first selection unit, comprising:
        a first transistor having a first terminal and a control terminal coupled to the first control terminal;
        a second transistor having a first terminal coupled to a second terminal of the first transistor, a control terminal coupled to the second control terminal, and a second terminal coupled to a low level voltage source;
        a third transistor having a first terminal coupled to a high level voltage source, and a control terminal coupled to the second terminal of the first transistor;
        a fourth transistor having a first terminal and a control terminal coupled to the second control terminal;
        a fifth transistor having a first terminal coupled to a second terminal of the fourth transistor, a control terminal coupled to the first control terminal, and a second terminal coupled to the low level voltage source; and a sixth transistor having a first terminal coupled to the low level voltage source, a control terminal coupled to the second terminal of the fourth transistor, and a second terminal coupled to a second terminal of the third transistor;

an inverter having an input terminal coupled to the second terminal of the third transistor; and a second selection unit, comprising:
  a seventh transistor having a first terminal and a control terminal coupled to the second terminal of the third transistor;
  an eighth transistor having a first terminal coupled to a second terminal of the seventh transistor, a control terminal coupled to an input terminal of the inverter, and a second terminal coupled to the low level voltage source;
  a ninth transistor having a first terminal coupled to the first input terminal, a control terminal coupled to the second terminal of the seventh transistor, and a second terminal coupled to the signal output terminal;
  a tenth transistor having a first terminal and a control terminal coupled to the input terminal of the inverter;
  an eleventh transistor having a first terminal coupled to the second terminal of the tenth transistor, a control terminal coupled to the second terminal of the third transistor, and a second terminal coupled to the low level voltage source; and
  a twelfth transistor having a first terminal coupled to the second input terminal, a control terminal coupled to the second terminal of the tenth transistor, and a second terminal coupled to the signal output terminal.

5. The gate driving circuit of claim 1, wherein the predetermined pulse signal is the (N+M)th pulse signal.

6. The gate driving circuit of claim 1, wherein the Nth stage output circuit further comprises an AND gate, having a first input terminal configured to receive the (N+M)th pulse signal, and a second input terminal configured to receive a second clock signal, a phase of the second clock signal is opposite to the phase of the first clock signal, wherein the predetermined pulse signal is an output signal of the AND gate.

7. The gate driving circuit of claim 1, wherein the first clock signal and the predetermined pulse signal have a same pulse width.

8. A display device, comprising:
a pixel matrix, comprising a plurality of pixels;
a plurality of data lines configured to transmit data signals to the plurality of pixels;
a plurality of scan lines configured to transmit gate signals to the plurality of pixels; and
a gate driving circuit, comprising plural-stage output circuits, an Nth stage output circuit of the plural-stage output circuits comprising:
  an Nth stage shift register configured to output an Nth pulse signal; and
  a mixer coupled to the Nth stage shift register and an (N+M)th stage shift register of an (N+M)th stage output circuit of the plural-stage output circuits connected to the Nth stage shift register in series, for outputting a Nth gate signal according to the Nth pulse signal and an (N+M)th pulse signal of the (N+M)th stage shift register, the Nth gate signal comprising at least two pulses with different duty cycles or phases;
wherein N and M are positive integers.

9. The display device of claim 8, wherein the mixer comprises:
  a first input terminal configured to receive a first clock signal;
  a second input terminal configured to receive a predetermined pulse signal;
  a first control terminal coupled to the Nth stage shift register for receiving the Nth pulse signal;
  a second control terminal coupled to the (N+M)th stage shift register for receiving the (N+M)th pulse signal;
  a signal output terminal coupled to a corresponding scan line; and
  a selection circuit configured to output the first clock signal at the signal output terminal when the mixer receives the Nth pulse signal, and output the predetermined pulse signal at the signal output terminal when the mixer receives the (N+M)th pulse signal;
  wherein pulse widths of the Nth pulse signal and the (N+M)th pulse signal are twice a pulse width of the first clock signal.

10. The display device of claim 9, wherein the selection circuit comprises:
  a first transistor having a first terminal and a control terminal coupled to the first control terminal;
  a second transistor having a first terminal coupled to a second terminal of the first transistor, a control terminal coupled to the second control terminal, and a second terminal coupled to a ground terminal;
  a third transistor having a first terminal coupled to the first input terminal, a control terminal coupled to the second terminal of the first transistor, and a second terminal coupled to the signal output terminal;
  a fourth transistor having a first terminal and a control terminal coupled to the second control terminal;
  a fifth transistor having a first terminal coupled to a second terminal of the fourth transistor, a control terminal coupled to the first control terminal, and a second terminal coupled to the ground terminal; and
  a sixth transistor having a first terminal coupled to the second input terminal, a control terminal coupled to the second terminal of the fourth transistor, and a second terminal coupled to the signal output terminal.

11. The display device of claim 9, wherein the selection circuit comprises:
a first selection unit, comprising:
  a first transistor having a first terminal and a control terminal coupled to the first control terminal;
  a second transistor having a first terminal coupled to a second terminal of the first transistor, a control terminal coupled to the second control terminal, and a second terminal coupled to a low level voltage source;
  a third transistor having a first terminal coupled to a high level voltage source, and a control terminal coupled to the second terminal of the first transistor;
  a fourth transistor having a first terminal and a control terminal coupled to the second control terminal;
  a fifth transistor having a first terminal coupled to a second terminal of the fourth transistor, a control terminal coupled to the first control terminal, and a second terminal coupled to the low level voltage source; and
  a sixth transistor having a first terminal coupled to the low level voltage source, a control terminal coupled to the second terminal of the fourth transistor, and a second terminal coupled to a second terminal of the third transistor;

an inverter having an input terminal coupled to the second terminal of the third transistor; and a second selection unit, comprising:
  a seventh transistor having a first terminal and a control terminal coupled to the second terminal of the third transistor;
  an eighth transistor having a first terminal coupled to a second terminal of the seventh transistor, a control terminal coupled to an input terminal of the inverter, and a second terminal coupled to the low level voltage source;
  a ninth transistor having a first terminal coupled to the first input terminal, a control terminal coupled to the second terminal of the seventh transistor, and a second terminal coupled to the signal output terminal;
  a tenth transistor having a first terminal and a control terminal coupled to the input terminal of the inverter;
  an eleventh transistor having a first terminal coupled to the second terminal of the tenth transistor, a control terminal coupled to the second terminal of the third transistor, and a second terminal coupled to the low level voltage source; and
  a twelfth transistor having a first terminal coupled to the second input terminal, a control terminal coupled to the second terminal of the tenth transistor, and a second terminal coupled to the signal output terminal.

12. The display device of claim 8, wherein the Nth stage output circuit further comprises an AND gate, having a first input terminal configured to receive the (N+M)th pulse signal, and a second input terminal configured to receive a second clock signal, a phase of the second clock signal is opposite to the phase of the first clock signal, wherein the predetermined pulse signal is an output signal of the AND gate.

13. The display device of claim 8, wherein the Nth gate signal comprise a first clock signal and a predetermined pulse signal, the first clock signal and the predetermined pulse signal have a same pulse width, and the first clock signal and the predetermined pulse signal outputted by the mixer are two pulse width apart.

* * * * *